United States Patent [19]

Thanos

[11] 4,246,542
[45] Jan. 20, 1981

[54] FILTER USING A STATE-VARIABLE BIQUADRATIC TRANSFER FUNCTION CIRCUIT

[75] Inventor: S. N. Thanos, Spring Valley, N.Y.

[73] Assignee: Rockland Systems Corporation, Rockleigh, N.J.

[21] Appl. No.: 37,057

[22] Filed: May 8, 1979

[51] Int. Cl.³ .............................................. H03F 1/36
[52] U.S. Cl. .................................. 330/107; 328/167; 330/76
[58] Field of Search ................ 328/167, 155; 330/107, 330/76, 109; 333/70 CR

[56] References Cited

U.S. PATENT DOCUMENTS

| 3,696,252 | 10/1972 | Chapman | 328/167 |
| 3,869,084 | 3/1975 | Longman | 328/167 |
| 3,924,199 | 12/1975 | Pearlman | 330/107 |

OTHER PUBLICATIONS

Electronics, Jan. 20, 1977, pp. 112, 113, "Input Capacitance Feedback—" by Martin Thomas.
"A Versatile Second Order Active Filter" by Roy Electronic Engineering, Feb. 1974, pp. 64–68.

*Primary Examiner*—H. Dixon
*Attorney, Agent, or Firm*—Frishauf, Holtz, Goodman & Woodward

[57] ABSTRACT

A second order section of an electronic filter comprises three cascaded amplifier stages and a compensating amplifier stage coupled between the first and second amplifier stages. The compensating stage introduces a leading phase shift at high frequencies so that the normalized transfer function of the circuit, for different frequencies, is substantially identical.

11 Claims, 6 Drawing Figures

FILTER USING A STATE-VARIABLE BIQUADRATIC TRANSFER FUNCTION CIRCUIT

BACKGROUND OF THE INVENTION

This invention relates to a complex filter, and more particularly to an electronic filter using a state-variable biquadratic transfer function circuit.

A filter should maintain the same normalized transfer function over a wide range of input frequencies. However, prior art electronic filters which comprise several cascaded second-order prototype sections have been found to have a deviation in the normalized transfer function at higher frequencies, typically above 10 KHz.

The object of the present invention is to provide an electronic filter in which the actual normalized transfer function is identical over a wide range of frequencies.

SUMMARY OF THE INVENTION

According to the present invention, a second order section of an electronic filter comprises three cascaded amplifier stages, and compensating amplifier stage coupled between the first two of the amplifier stages to introduce a leading phase shift at high frequencies. Resistors couple the outputs of the compensating and second amplifier stages to the next successive stages, respectively, and feedback capacitors are connected to the second and third amplifier stages, respectively. Variable resistance means couples the output of the second amplifier stage to an input of the first amplifier stage for varying the Q factor of the filter.

DETAILED DESCRIPTION

Figure 1:
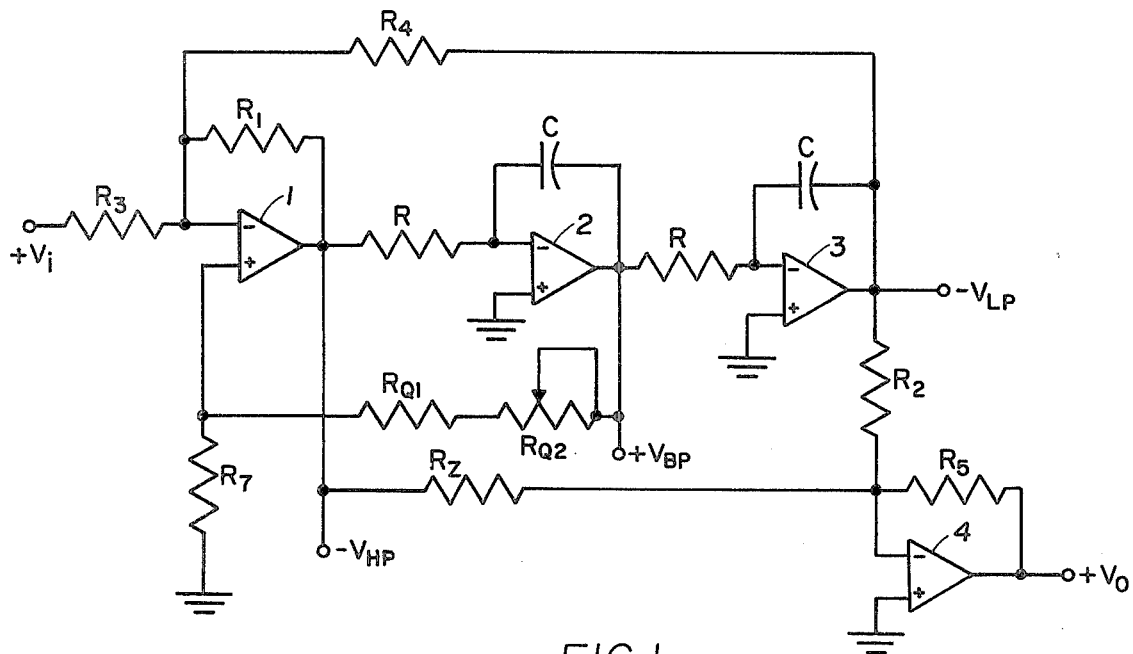
FIG. 1 illustrates a prior art state-variable electronic filter using a second-order prototype stage.

A prior art complex filter, i.e., consisting of many poles, and zeroes is generally synthesized by cascading several second-order prototype sections (and a single first-order prototype if the degree of the filter is odd). FIG. 1 illustrates one such prior art second-order prototype section. The state variable or H-K-N[(1)] synthesis technique is commonly used to implement second-order prototypes. Such circuits are easily implemented using today's IC technology.

[(1)] "State-Variable Synthesis for Insensitive Integrated Circuit Transfer Functions", Kerwin W. J. Huelsman, L. P. and R. W. Newcomb, IEEE Journal of Solid-State Circuits, vol. sc-2, No. 3, September 1967

The prior art second-order prototype section of FIG. 1 comprises three dual input operational amplifier stages 1, 2, 3, the operational amplifier 1 having a feedback resistor $R_1$, and the operational amplifiers 2, 3 having feedback capacitors C coupled to their respective first inputs. Resistors R respectively connect the output of amplifier 1 to the first input of amplifier 2, and the output of amplifier 2 to the first input of amplifier 3. The second inputs of amplifiers 2 and 3 are grounded. The input signal is connected to terminal $V_i$ which is connected to the first input of amplifier 1 via a resistor $R_3$.

A feedback circuit comprised of resistors $R_{Q1}$ and $R_{Q2}$ is connected between the output of amplifier 2 and an input of amplifier 1 for varying the "Q" of the circuit. A further feedback circuit between the output of amplifier 3 and the first input of amplifier 1 comprises a feedback resistor $R_4$.

The filter of FIG. 1 further comprises a dual input operational amplifier output stage 4, a first input of which is connected to the output of amplifier 3 via a resistor $R_2$, and to the output of amplifier 1 via a resistor $R_z$. A resistor $R_5$ feeds back the output of amplifier 4 to the first input thereof.

Second-order prototype stages of FIG. 1 may be cascaded by connecting the output terminal $V_0$ with the input terminal $V_i$ of the next succeeding filter stage. By adding additional second-order prototype sections or stages, additional poles and zeroes of the complex filter are added. If the degree of the filter is odd, a single first-order prototype stage may be added into the cascade, a typical prior art single first-order prototype stage being illustrated in FIG. 2.

Figure 2:
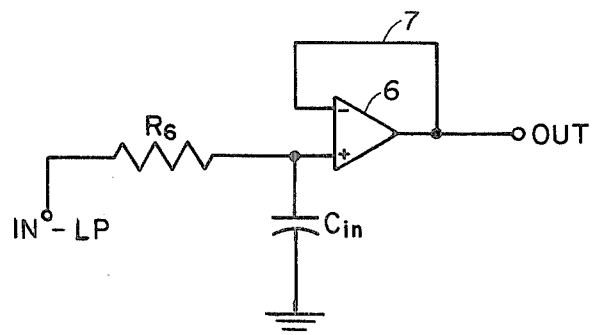
FIG. 2 illustrates a prior art first-order prototype stage for an electronic filter.

The single first-order prototype stage of FIG. 2 comprises an operational amplifier 6 having its output fed back to one of the inputs thereof via a line 7. The other input to operational amplifier 6 is connected to an RC circuit comprising a resistor $R_6$ which is connected to an input terminal and a capacitor $C_{in}$ coupled to ground to provide a low pass prototype. If it is desired to connect a first-order prototype stage of FIG. 2 in a cascade of second-order prototype stages of FIG. 1, the input terminal of FIG. 2 is connected to the terminal $+V_o$ in FIG. 1, and the output terminal of the FIG. 2 circuit is connected to the input terminal $+V_i$ in FIG. 1 of the next successive stage.

The advantages of the cascaded filter using stages as discussed above are that low-pass, high-pass and band-pass operation is easily obtained by choosing the output port. For example, if the output is taken at the terminal $V_{BP}$ illustrated in FIG. 1, the filter is a bandpass filter (second-order pole). If the output is taken at the terminal $V_{LP}$ of FIG. 1, the filter becomes a low-pass filter (second-order pole). If the output is taken at the terminal $V_{HP}$ of FIG. 1, the filter becomes a high-pass filter (second-order zero).

If the output is taken at the terminal $V_o$ of FIG. 1, the filter is an all pass filter (second-order pole, second-order zero). By selecting the summing resistors R2 and Rz, the relative gain of the low frequency signal ($V_{LP}$) and high frequency signal ($V_{HP}$) are affected. This output then allows the realization of both poles and zeros, i.e., a transfer function of the form:

$$H(s) = \frac{K_1(s^2 + b_1 s + b_2)}{s^2 + a_1 s + a_2}$$

where $K_1$, $a_1$, $a_2$, $b_1$, $b_2$ define the filter shape and position of poles and zeroes and are functions of the resistor and capacitor values (see J. G. Graeme, G. E. Tobey and L. P. Huelsman, *Operational Amplifiers*, Ch. 8, McGraw Hill, 1971); and S is a complex variable.

Further, in the circuit of FIG. 1, the Q, gain and pole frequency of the second-order prototype are independently selectable. For example, the Q of the circuit is varied by varying the resistor $R_{Q2}$. The pole frequency of the second-order prototype which may be independently selectable, is particularly important in the design of a variable filter. For such a variable filter, the cut-off frequency is varied by changing either the value of the resistors R or the value of the capacitors C. When such variations in the R's and/or C's are made, the filter maintains its Q and gain values. Thus, the same normalized transfer function should result, regardless of the cut-off frequency. As a result of maintaining the same normalized transfer function, the overall response of a cascade of second-order sections will also maintain its normalized transfer function.

The circuit of FIG. 1 was designed to provide a Q of 10, assuming that the amplifiers are ideal. For a cut-off frequency of 500 Hz, the following values were used:

resistors R=3.18 KΩ;
$R_1$, $R_3$, $R_4$ and $R_7$=2.2 KΩ;
$R_2$ and $R_5$=2.0 KΩ;
$R_{Q1}$=60.4 KΩ;
$R_{Q2}$=5 KΩ;
$R_z$=5.56 KΩ;
capacitors C=0.1 uf; and
amplifiers 1, 2, 3 and 4=LF 347 (National Semiconductor)

For the cut-off frequency of 50 KHz, the value of resistors R are 3.18 KΩ and the values of capacitors C are 1000 pf, all other values remaining the same.

Figure 3:
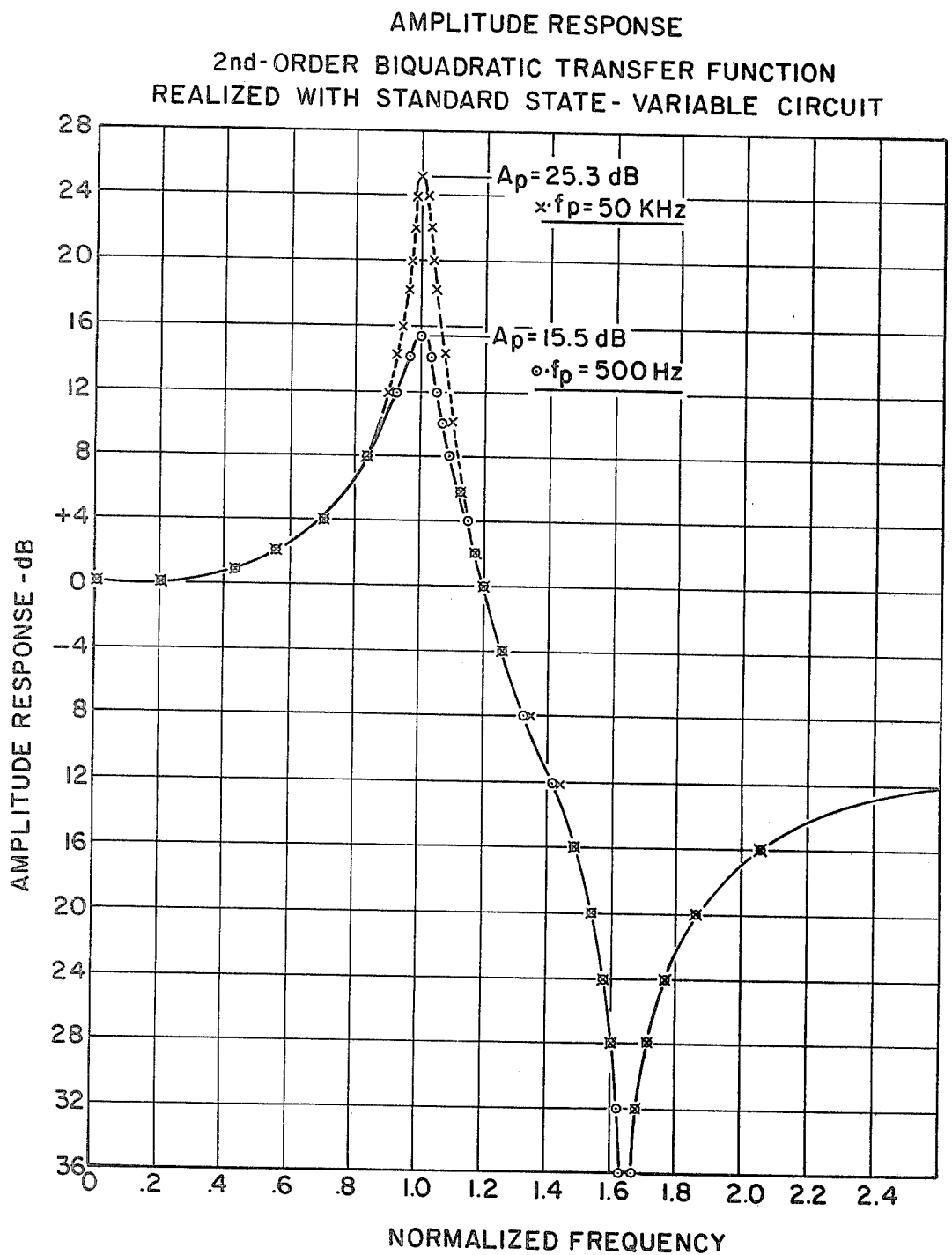
FIG. 3 illustrates the normalized transfer function of the filter illustrated in FIG. 1 for the frequencies 500 Hz and 50 KHz.

FIG. 3 illustrates the transfer function for low and high frequencies (500 Hz and 50 KHz, respectively) for the above-discussed prior art circuits. For ideal amplifiers the two normalized transfer functions would be identical. However, since the amplifiers 1-4 are not in fact ideal, the normalized transfer functions are seen not to be identical.

It has been found that the parasitic capacitance of the amplifiers introduces a lagging phase shift at high frequencies, typically at 50 KHz for present operational amplifiers, affecting a change in the Q and gain of a second-order section from its ideal characteristic. This would preclude the use of such a known second-order prototype for implementing a variable filter operating at cut-off frequencies above 10 KHz.

Figure 4:
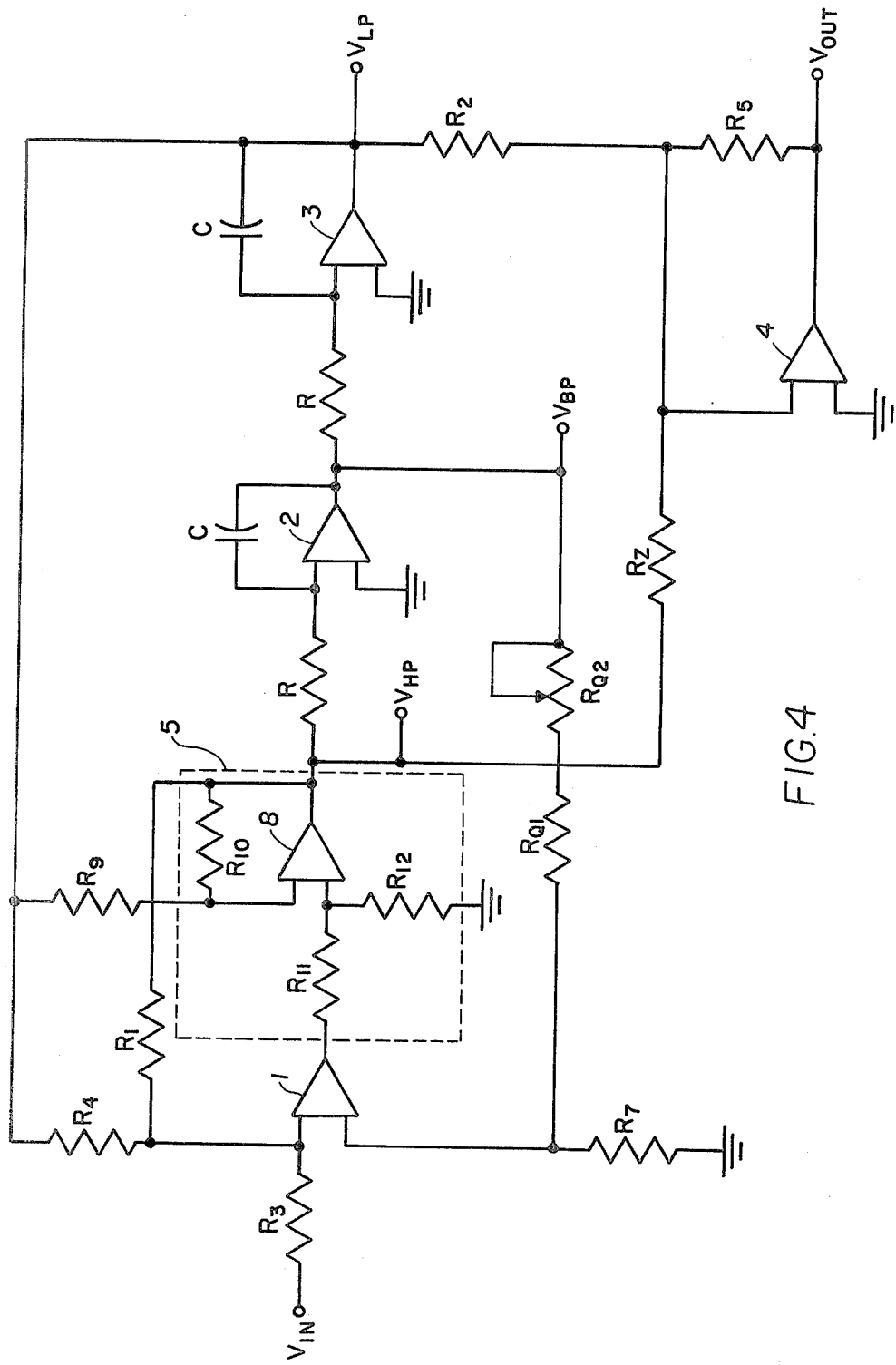
FIG. 4 is a circuit diagram of the improved second-order prototype electronic filter of the present invention.

FIG. 4 shows an embodiment of the present invention (using specific values). In FIGS. 1 and 4, the same reference numerals are used for corresponding elements. According to the present invention, an additional amplifier section 5, outlined in dashed lines and comprising an amplifier 8, is provided to introduce a leading phase shift at high frequencies. If the amplifiers 1-3 and 8 are matched, this will compensate for the lagging phase shift introduced by the parasitic capacitance of other amplifiers 1, 2 and 3. Feedback resistor $R_1$ in FIG. 4 is coupled between the output of amplifer 8 and the first input of amplifier 1. The Q adjusting feedback resistors $R_{Q1}$ and $R_{Q2}$ are coupled between the output of amplifier 2 and the second input of amplifier 1.

Figure 5:
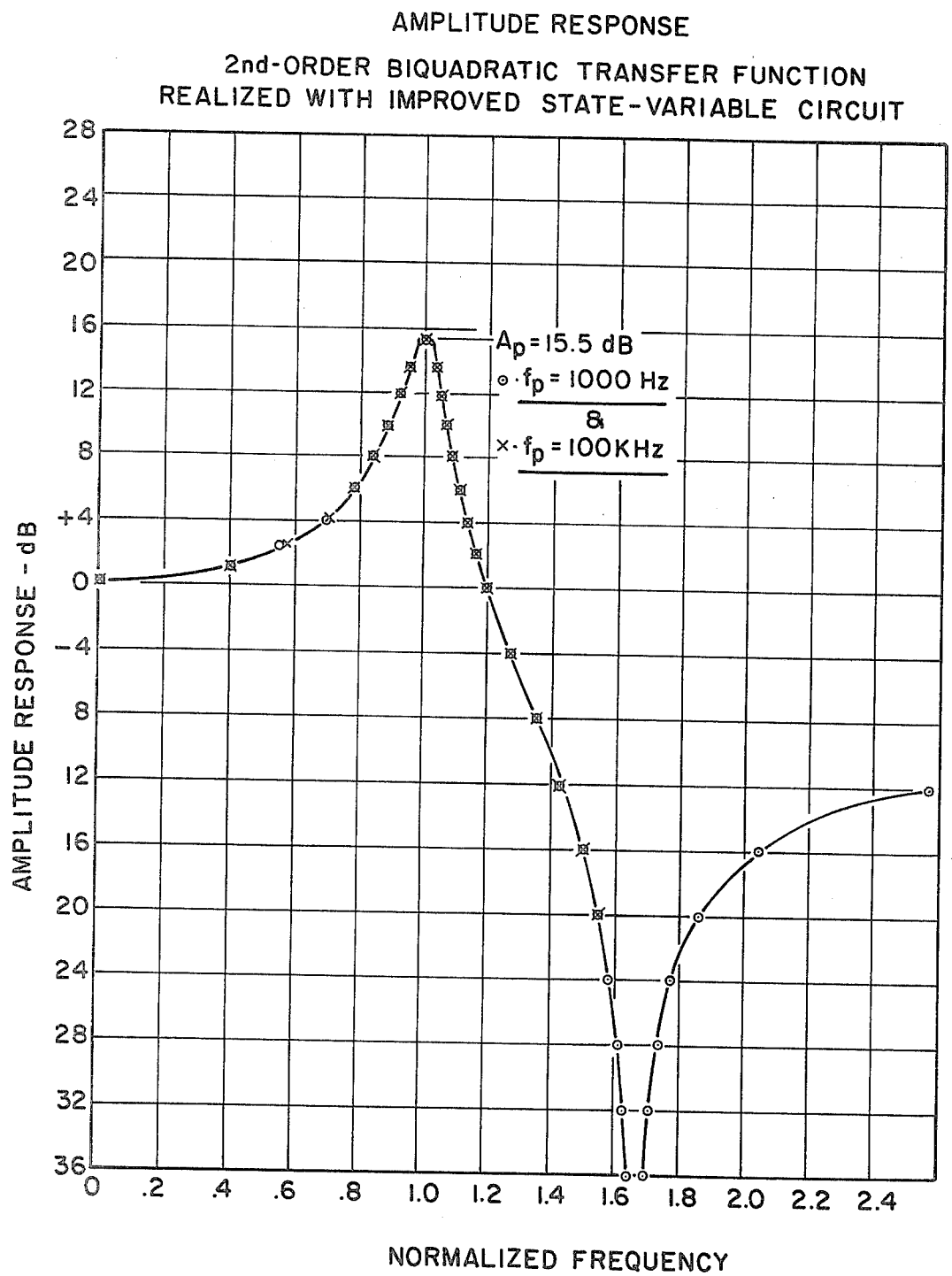
FIG. 5 illustrates the normalized transfer function of the improved electronic filter of the present invention for the frequencies 1 KHz and 100 KHz.

Matching of amplifiers is normally difficult to achieve over a range of temperatures. However, manufacturers are now producing four amplifiers on a chip, e.g. LF347 (National Semiconductor), or TL074 (manufactured by Texas Instruments, Inc.), whose characteristics are matched and track with temperature. Using such an IC, an improved state-variable filter using the FIG. 4 circuit was implemented. Its normalized transfer function for pole frequencies 1 KHz and 100 KHz, as shown in FIG. 5, was identical, thus, verifying the technique of the present invention.

For the cut-off frequency 1000 Hz, the values in the circuit of FIG. 4 are as follows:

Resistors R=1.59 KΩ
$R_1$, $R_3$, $R_7$, $R_4$, $R_9$, $R_{12}$=2.2 KΩ
$R_2$ and $R_5$=2.0 KΩ
$R_{10}$ and $R_{11}$=4.4 KΩ
$R_{Q1}$=60.4 KΩ
$R_{Q2}$=5.0 KΩ
$R_z$=5.56 KΩ
Capacitors C=0.1 μf
Amplifiers 1, 2, 3 and 6=LF347 (National Semiconductor)
Amplifier 4=LF351 (National Semiconductor)

For the cut-off frequency 100 KHz, the values of the resistors R are 1.59 KΩ and the values of capacitors C are 1000 pf, all other values remaining the same.

Figure 6:
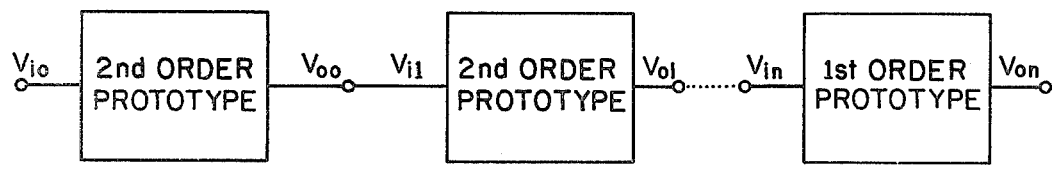
FIG. 6 illustrates realization of a filter as a cascade of first and second order sections.

FIG. 6 illustrates a realization of a filter as a cascade of first and second order sections. The second order prototype sections are preferably those of the present invention, although prior art sections could be used, but without the advantages obtained by the present invention. The first order prototype stage illustrated in FIG. 6 may be the prior art stage shown in detail in FIG. 2.

While the invention has been described above with respect to a specific embodiment, it should be clear that various modifications and alterations may be made to the invention within the spirit and scope of the accompanying claims.

I claim:

1. An electronic filter stage comprising:
   a first input amplifier stage (1);
   a second compensating amplifier stage (5) coupled to the output of said amplifier stage (1);
   a third amplifier stage (2) coupled to the output of said second compensating amplifier stage (5) via a resistor (R);
   a fourth amplifier stage (3) coupled to the output of said third amplifier stage (2) via a resistor (R);
   a first capacitor coupling the output of said third amplifier stage to an input thereof;
   a second capacitor (C) coupling the output of said forth amplifier stage to an input thereof; and
   variable resistance means coupling the output of said third amplifier stage to an input of said first amplifier stage for varying the Q factor of the filter stage.

2. The electronic filter stage of claim 1 further comprising a fifth amplifier stage (4) coupled to the outputs of said compensating amplifier stage (5) and of said fourth amplifying stage (3), the output of said fifth amplifying stage providing the output of said electronic filter stage.

3. The electronic filter stage of claim 1 or 2 wherein each of said amplifier stages comprises a dual-input operational amplifier.

4. The electronic filter stage of claim 1 or 2 wherein said first, second, third and fourth amplifier stages comprise amplifiers formed on a single integrated circuit chip.

5. The electronic filter stage of claim 4 wherein each of said amplifier stages comprises a dual-input operational amplifier.

6. The electronic filter stage of claim 1 wherein the output of said second compensating amplifier stage comprises a high pass filter output; the output of said third amplifier stage comprises a band pass filter output; and the output of said fourth amplifier stage comprises a low pass filter output.

7. An electronic filter comprising a cascade of electronic filter stages, said cascade comprising at least one second order prototype stage, said second order prototype stage comprising:
   a first input amplifier stage (1);
   a second compensating amplifier stage (5) coupled to the output of said first amplifier stage (1);
   a third amplifier stage (2) coupled to the output of said second compensating amplifier stage (5) via a resistor (R);
   a fourth amplifier stage (3) coupled to the output of said third amplifier stage (2) via a resistor (R);
   a first capacitor coupling the output of said third amplifier stage to an input thereof;
   a second capacitor (C) coupling the output of said fourth amplifier stage to an input thereof;
   variable resistance means coupling the output of said third amplifier stage to an input of said first amplifier stage for varying the Q factor of the filter stage; and
   a fifth amplifier stage (4) coupled to the output of said fourth amplifier stage and to the output of said second amplifier stage and providing an output to be connected to the input of the next sucessive cascaded electronic filter stage.

8. The electronic filter of claim 7 wherein each of said amplifier stages comprises a dual-input operational amplifier.

9. The electronic filter of claim 7 or 8 wherein said first, second, third and fourth amplifier stages comprise amplifiers formed on a single integrated circuit chip.

10. The electronic filter of claim 7 or 8 comprising at least one first order filter stage coupled to at least one of an input of said first amplifier stage and the output of said fifth amplifier stage.

11. The electronic filter of claim 7 wherein the output of said second compensating amplifier stage comprises a high pass filter output; the output of said third amplifier stage comprises a band pass filter output; and the output of said fourth amplifier stage comprises a low pass filter output.

* * * * *